United States Patent [19]

Taggart

[11] 4,215,294
[45] Jul. 29, 1980

[54] AUTOMATIC INTENSITY CONTROL CIRCUIT FOR AN OSCILLOSCOPE

[75] Inventor: John E. Taggart, Beaverton, Oreg.
[73] Assignee: Tektronix, Inc., Beaverton, Oreg.
[21] Appl. No.: 954,065
[22] Filed: Oct. 23, 1978
[51] Int. Cl.² ............................................. H01J 29/52
[52] U.S. Cl. .................................... 315/383; 358/168
[58] Field of Search ......................... 315/383, 30, 381; 358/168

[56] References Cited
U.S. PATENT DOCUMENTS

| | | | |
|---|---|---|---|
| 3,757,156 | 9/1973 | Müeller et al. | 315/30 |
| 3,775,637 | 11/1973 | Brady | 315/30 |
| 3,848,945 | 11/1974 | Holzrichter | 315/30 |

*Primary Examiner*—Theodore M. Blum
*Attorney, Agent, or Firm*—George T. Noe

[57] ABSTRACT

An automatic intensity control circuit is provided for maintaining a constant perceived display brightness in an oscilloscope under varied operating conditions. The circuit includes an averaging circuit, a translation circuit, and a multiplier circuit to develop a cathode-ray tube grid bias control voltage which is inversely proportional to the duty cycle of the time-base sweep gate signal. Two or more such automatic intensity control circuits may be multiplexed for multi-trace oscilloscopes to maintain a constant perceived brightness when alternating between two or more traces.

8 Claims, 4 Drawing Figures

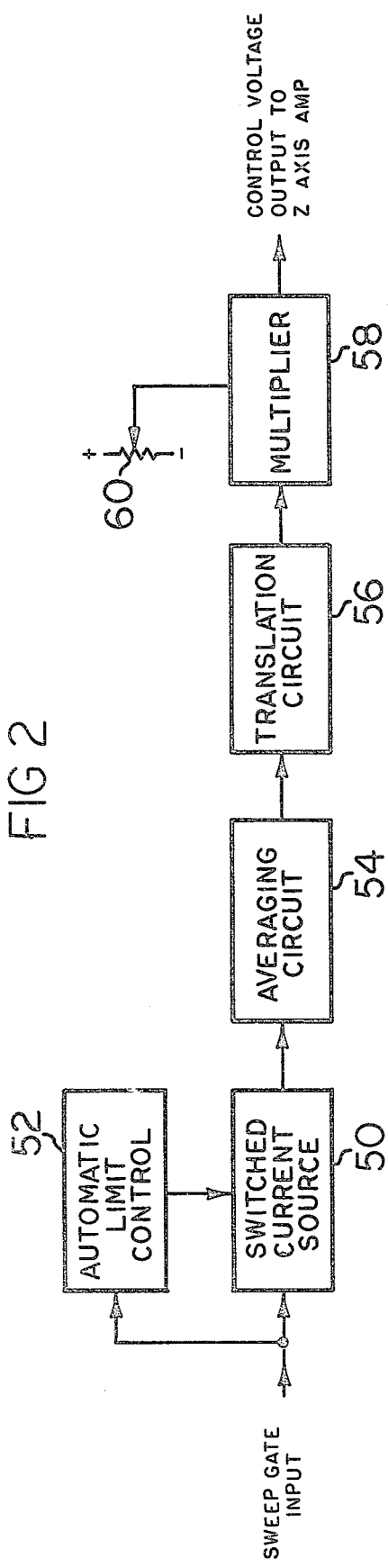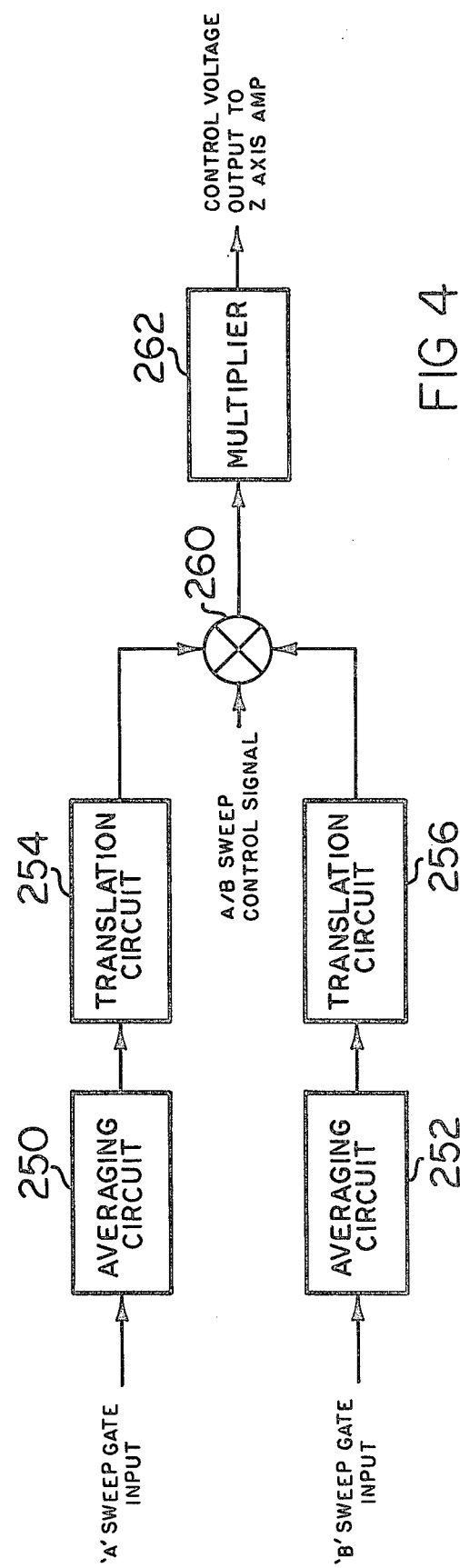

AUTOMATIC INTENSITY CONTROL CIRCUIT FOR AN OSCILLOSCOPE

BACKGROUND OF THE INVENTION

The visual brightness, or intensity, of an oscilloscope display is dependent upon several factors, including cathode-ray tube beam current, phosphor writing rate, sweep rate, signal repetition rate, and the functional abilities of the eye of an observer. In particular, in repetitive-sweep operating situations wherein the sweep repeats at a rate higher than the critical fusion frequency of the eye, which is the frequency at which a flicker can no longer be discerned, light levels of the individual sweeps are integrated by the eye so that the average brightness perceived is proportional to the ratio of the time the sweep trace on the viewing screen to the time it is off the screen. Hence, the brightness of the display becomes dependent upon the timing of trigger signals which initiate the sweep and the setting of the sweep rate switch. Generally speaking, application of a lower repetition-rate signal to the oscilloscope vertical input causes a lower duty cycle and therefore requires a manual adjustment of the beam intensity to increase the display brightness, and application of a higher repetition-rate signal causes a higher duty cycle and therefore requires a manual adjustment of the beam intensity to reduce the display brightness.

Attempts to solve the foregoing problem have been inadequate. Typically, the prior art involves an averaging circuit which responds to a sweep sawtooth or gate signal to generate a control signal, which signal is then applied to the biasing circuit of the cathode-ray tube to change the electron beam current when changes occur in the duty factor of the sweep signal. However, the control signal voltage, which is added to a fixed unblanking voltage level, does not provide a first order correction of beam intensity. For example, it can be seen that if the control voltage is very small compared to the unblanking voltage, halving the duty cycle does not result in the desired doubling of the beam current to maintain a constant intensity. Instead, the overall bias voltage change is very slight, resulting in an almost imperceptible correction of brightness.

Another problem associated with averaging circuits of the prior art automatic intensity circuits is that when extremely low-repetition-rate signals are applied to the vertical amplifier input, long time periods exist between triggered sweeps. After the termination of a sweep, the averaging capacitor begins to discharge so that when a new sweep is initiated, little or no correction at all is available. Depending upon the sweep rate and the ability of the averaging circuit to respond, the result may be either a sweep trace which begins bright and then dims as the trace progresses, or a sweep trace which simply stays bright. Further, for oscilloscopes having dual time bases which are alternatively displayed, one trace may be normal intensity while the other may be bright.

SUMMARY OF THE INVENTION

The present invention relates generally to oscilloscope cathode-ray tube biasing circuits, and in particular to automatic intensity circuits for maintaining a constant perceived brightness under varied operating conditions, such as changes in the timing of triggering signals and changes in sweep rates.

The automatic intensity circuit includes an averaging circuit, a translation circuit, and a multiplier circuit. The averaging circuit includes a current source which is switched on and off by the sweep gate signal, and a capacitor which is charged to a voltage which is proportional to the duty cycle of the sweep gate. Connected to the averaging circuit is the translation circuit, which is essentially a modified current mirror that performs a signal compression function and a characteristic-curve-fitting function to match the cathode-ray tube requirements. The multiplier circuit comprises a Gilbert multiplier with a feedback control loop and a current-to-voltage converter to provide a control voltage which is proportional to the reciprocal of the duty cycle of the sweep gate. The control voltage is output to the Z-axis amplifier to control the bias voltage applied to the cathode-ray tube grid. The overall effect is that changes in duty cycle of the sweep gate produce a reciprocal change in the beam intensity, maintaining a constant perceived brightness of the display.

A timing circuit may be provided to clamp the averaging circuit at a predetermined value if the pulse repetition frequency of the sweep gate falls below a predetermined limit, thereby providing a quick recovery of automatic intensity control upon initiation of a new sweep. Also, for dual time base oscilloscopes, two such automatic intensity control circuits may be provided, one for each of the two sweep traces. Appropriate multiplexing may be provided at either the input or the output of the multiplier circuit.

It is therefore one object of the present invention to provide an automatic intensity control circuit to maintain a constant perceived brightness of a cathode-ray tube display, irrespective of timing of trigger signals or sweep speed.

It is another object to provide an automatic intensity control circuit employing a multipler circuit so that correction provided thereby is proportional to the reciprocal of the error.

It is a further object to provide an automatic intensity control which limits trace brightness when the sweep repetition rate falls below a predetermined limit.

It is an additional object to provide an automatic intensity control which maintains a constant perceived trace brightness when alternating between two or more sweeps having different sweep speeds.

Other objects and advantages of the present invention will become apparent to those having ordinary skill in the art when taken in conjunction with the accompanying drawings.

BRIEF DESCRIPTION OF THE DRAWINGS

FIG. 2 shows a block diagram of an automatic intensity control circuit in accordance with the present invention;

FIG. 4 shows a block diagram of a multiplexed dual automatic intensity control.

DETAILED DESCRIPTION

Figure 1:
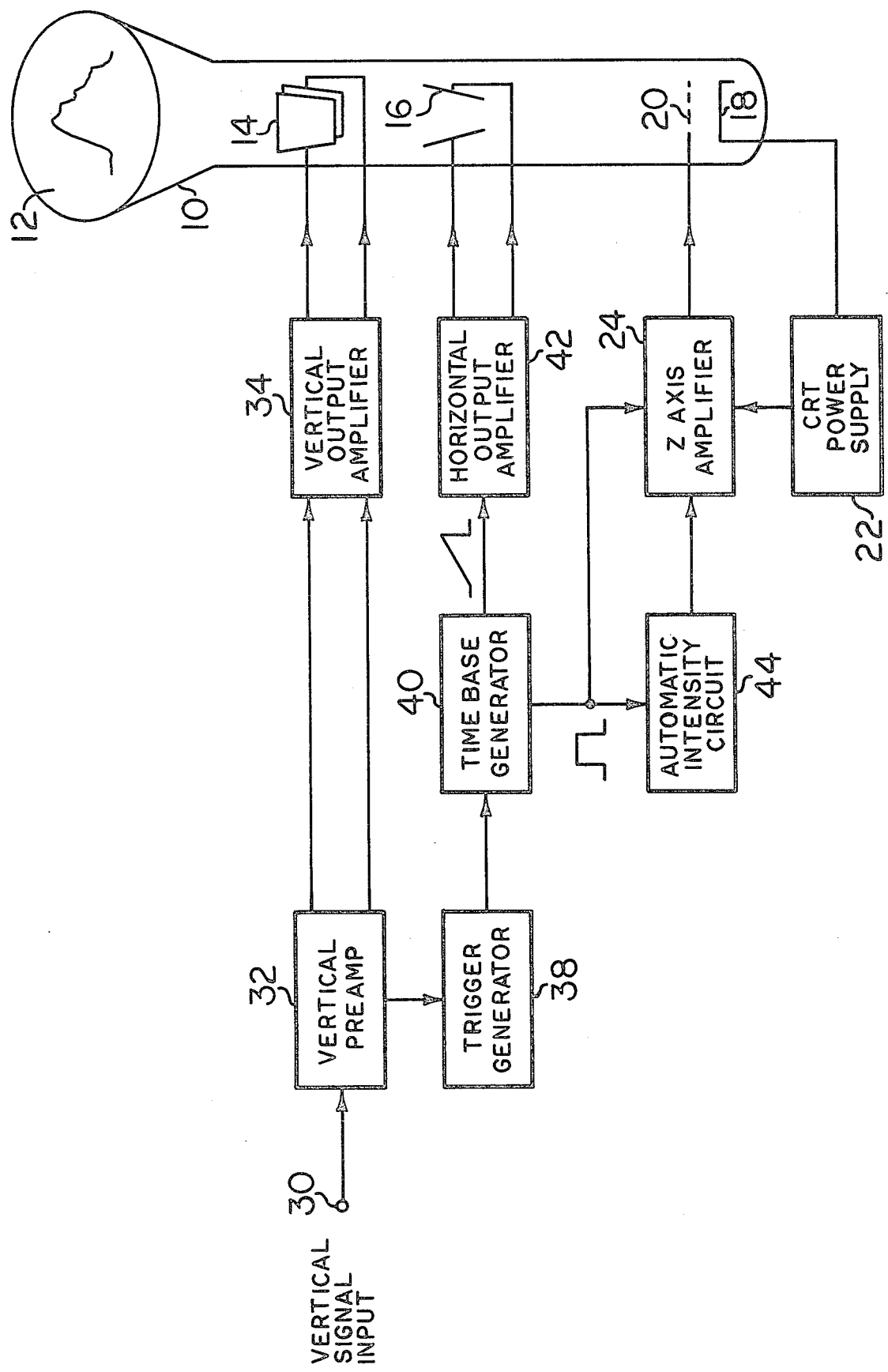
FIG. 1 shows a block diagram of an oscilloscope having an automatic intensity control.

Referring to FIG. 1, there is shown a block diagram of an oscilloscope. A cathode-ray tube (CRT) 10 is provided with a display screen 12, a pair of vertical deflection plates 14, a pair of horizontal deflection plates 16, and an electron gun including a cathode 18 and a grid 20 for producing an electron beam. Other CRT elements, such as focus electrodes and accelerating anodes, are not essential to an understanding of the present invention, and are therefore omitted. A CRT power supply 22 produces an appropriate high voltage, for example, −2000 volts, for operation of the CRT, and such high voltage is applied to the cathode 18 and to a biasing circuit portion of Z-axis amplifier 24 to control the grid-to-cathode voltage.

A signal to be displayed upon the display screen 12 of the CRT is applied via a vertical input terminal 30 to a vertical preamplifier 32. The vertical preamplifier includes signal coupling and attenuator circuits to condition the input signal, which is then applied to the vertical output amplifier 34. The vertical output amplifier provides a push-pull output signal having an amplitude suitable to drive the vertical deflection plates 14 to deflect the electron beam in a vertical direction in accordance with the instantaneous amplitude of the input signal. Assuming a repetitive input signal, a sample thereof is applied to a trigger generator circuit 38, wherein the signal is compared with a predetermined reference voltage to produce sweep triggers, which are applied to a time-base generator circuit 40 to initiate a recurrent sweep-driving sawtooth signal. The time base generator 40 includes timing circuits to provide a range of selectable predetermined sweep rates. The sweep sawtooth signal is applied to a horizontal output amplifier 42, where it is split into a push-pull signal suitable to drive the horizontal deflection plates 16 to deflect the electron beam in a horizontal direction in accordance with instantaneous amplitude of the sweep sawtooth signal. A gate signal is produced coincident with the sweep sawtooth signal by the time base generator 40, which gate signal is simultaneously applied to the Z axis amplifier 24 and to an automatic intensity control circuit 44. As mentioned previously, the Z axis amplifier 24 controls the CRT grid voltage, and, hence, beam intensity and display brightness. The sweep gate is utilized to blank the CRT during sweep retrace or flyback. The automatic intensity control circuit 44, which is to be described in detail, develops a control voltage which is proportional to the reciprocal of the duty cycle of the sweep gate. This control voltage is applied to the Z-axis amplifier to control the CRT bias voltage to maintain a constant perceived brightness of the display.

A block diagram of the automatic intensity control circuit 44 is shown in FIG. 2. The sweep gate signal may be applied simultaneously to a switched current source 50 and an automatic limit control circuit 52 which will be discussed later. The current source 50 is switched on by the sweep gate during the time that the sweep is running, that is, while a sweep sawtooth is being produced, and a predetermined constant current is passed to an averaging circuit 54. When the sweep is off, the current source is off. Thus the averaging circuit 54 responds to a gated current to develop an output which is proportional to the duty cycle of the sweep gate.

The averaging circuit output is applied to a translation circuit 56, which is essentially a modified current mirror that performs a signal compression function and a characteristic-curve-fitting function to match the operating requirements of the CRT, since the grid bias versus beam current of the CRT is a non-linear function. The current ouput from the translation circuit 56 is applied to a multiplier circuit 58. The multiplier circuit may suitably be a Gilbert multiplier employing a feedback loop and a current-to-voltage converter to provide a control voltage which is proportional to the reciprocal of the duty cycle of the sweep gate. A front-panel intensity or brightness control, represented by variable resistor 60, may be incorporated into the multiplier circuit so that the control voltage output therefrom includes the manually adjustable control component as well as the automatic control component. The control voltage output is applied to the Z-axis amplifier to control the CRT grid voltage, as shown in FIG. 1.

The automatic limit control circuit 52 mentioned hereinabove may be provided to clamp the averaging circuit at a predetermined value if the pulse repetition frequency of the sweep gate falls below a predetermined limit, thereby limiting the maximum display brightness and providing a quick recovery of automatic intensity control upon initiation of a new sweep. During the time that a sweep is running, the automatic limit control circuit 52 is reset and held. Upon termination of the sweep, the limit control circuit is activated and a predetermined time interval is started. At the end of this time interval, if no new sweep has been initiated, the limit control circuit 52 turns on the current source 50, which in turn passes current to the averaging circuit 54. The Z-axis amplifier sees this action as the equivalent of a unity duty cycle and sets the CRT to a predetermined viewing intensity as established by the front-panel intensity control. Upon initiation of a new sweep, the automatic light control circuit 52 is reset and the current source 50 is under control of the sweep gate signal applied thereto. Of course, as long as the sweep recurs above a predetermined rate, the automatic limit contro circuit will be successively reset on each sweep and thereby not complete the timing cycle described above.

Figure 3:
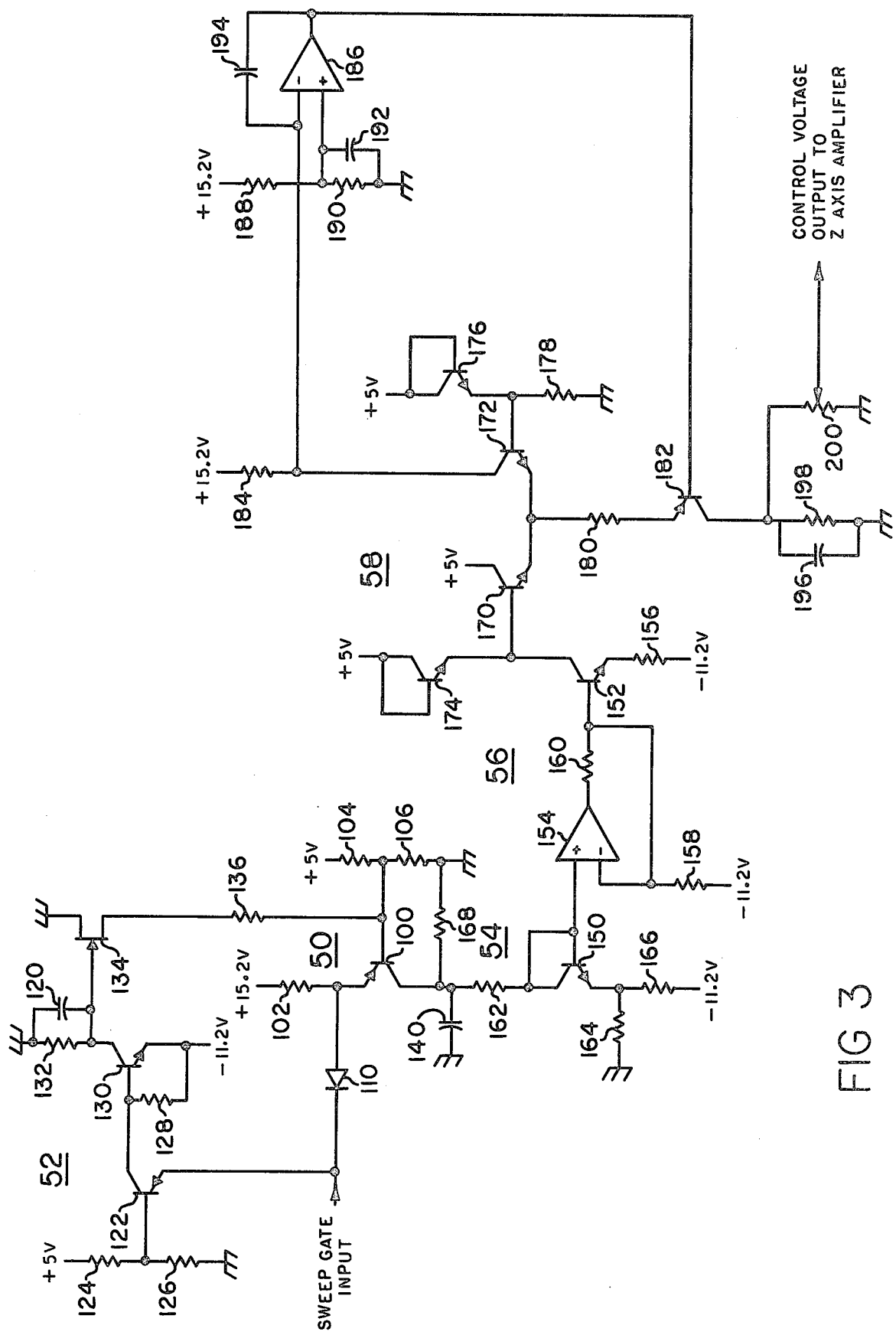
FIG. 3 shows a detailed schematic of the automatic intensity control circuit of FIG. 2.

FIG. 3 shows a detailed schematic of the automatic intensity control circuit just described in block diagram terms in connection with FIG. 2. The switched current source 50 includes a transistor 100, the emitter of which is connected through a current-setting resistor 102 to a suitable source of positive voltage. The base of transistor 100 is connected to the junction of bias-setting resistors 104 and 106, which are connected between a suitable positive voltage supply and ground to form a voltage divider. A diode 110 is connected in the circuit path between the gate signal input and the emitter of transistor 100 to control the switching of the current source. The sweep gate signal may be described in terms of logical highs and lows, and may indeed be effected by logic circuitry within the time-base generator. When the sweep is running, the sweep gate is high, and diode 110 is reverse biased. This allows transistor 100 to conduct. During the time that the sweep is off, the gate signal is low, forward-biasing diode 110 and pulling the emitter of transistor 100 negative, turning the transistor off.

The automatic limit control circuit 52 is connected between the sweep gate signal input and the base of transistor 100, and comprises principally capacitor 120, its charge and discharge paths, and control circuitry therefor. The emitter of a transistor 122 is connected to the sweep gate input path, while the base thereof is connected to the junction of a pair of biasing resistors 124 and 126 connected as a voltage divider between a suitable positive voltage supply and ground. The collector of transistor 122 is connected through a collector-load resistor 128 to a suitable negative voltage supply. A transistor 130 has its base connected to the collector of transistor 122, and its emitter connected to the aforementioned negative voltage supply. The previously mentioned capacitor 120 is connected in parallel with a resistor 132, and this combination is connected between the collector of transistor 130 and ground. Transistor 130 provides the charging path for capacitor 120, and resistor 132 provides the discharge path. Finally, to complete the automatic limit control circuit, a field-effect transistor (FET) 134 and resistor 136 are serially connected between ground and the base of the current source transistor 100, and the gate of FET 134 is connected to the junction of capacitor 120, resistor 132, and the collector of transistor 130. When the sweep gate signal is high (sweep running), transistor 122 is turned on, turning resistor 130 on to provide substantial charging current to capacitor 120. The collector voltage of transistor 130 moves negative as the capacitor quickly charges, pinching off the channel of FET 134 and thus preventing any current through resistor 136. Of course, during this period, the current source transistor 100 is also turned on, as discussed in the preceding paragraph. Upon termination of the sweep, the sweep gate signal goes low, turning off transistors 122 and 130, as well as current-source transistor 100, and allowing capacitor 120 to begin to discharge through resistor 132 at an RC-controlled rate. After a predetermined interval of time following the termination of a sweep, capacitor 120 discharges to a voltage which biases FET 134 into conduction. When FET 134 turns on, the base of the current-source transistor 100 is pulled negative due to the voltage developed across the FET and resistor 136, causing current to pass through transistor 100 to the averaging circuit 54. Upon initiation of a new sweep, the sweep gate signal goes high, resetting the limit control circuit by turning on transistors 122 and 130, causing capacitor 120 to charge and thereby turn off FET 134. As described above in connection with the block diagram of FIG. 2, as long as the sweep recurs above a predetermined rate, the automatic limit control circuit will successively reset on each sweep and thereby not complete the timing cycle to turn on the current source.

The averaging circuit 54 comprises principally capacitor 140 and its charge and discharge paths. Associated with the averaging circuit 54 is the current source 50, which provides the charging path for capacitor 140, and the translation circuit 56, which provides the discharge path.

The translation circuit 56 is actually a modified current mirror comprising a diode-connected transistor 150 and a transistor 152, with a unity-gain buffer amplified 154 interposed between the bases of these transistors. A resistor 156 is connected between the emitter of transistor 152 and the negative supply. Associated with the unity-gain buffer amplifier 154 are equal-valued resistors 158 and 160. The collector and base of transistor 150 are connected through a resistor 162 to capacitor 140 and the collector of transistor 100. The emitter of transistor 150 is connected to the junction of resistors 164 and 166, which resistors form a voltage divider between ground and the negative voltage supply to slightly elevate the transistor emitter above the supply. A resistor 168, which may suitably have a value of several megohms, is connected between ground and the junction of resistor 162, capacitor 140, and the collector of transistor 100 to mainatain at least some current through transistor 150 if for some reason transistor 100 or capacitor 140 fail to supply current through resistor 162.

When the current source 50 is gated on by the positive-going sweep gate pulse, a constant current, which may be about 2.5 milliamperes, for example, flows from the collector of transistor 100 into the averaging circuit 140. Depending upon the state of charge of capacitor 140 and the duty cycle of the sweep gate, a current flows through resistor 162 and transistor 150 which is representative of the average voltage of the sweep gate signal and hence is proportional to the duty cycle of the sweep gate. The voltage developed at the collector and base of transistor 150 is transmitted via the high-impedance buffer amplifier 154 to the base of transistor 152. While the operation of transistor 152 "mirrors" the conduction of transistor 150, the transistor 152 collector current is scaled in accordance with the value of resistor 156. Furthermore, the operating point of transistor 152 may be shifted slightly from the operating point of transistor 150 to effect a match of the automatic intensity circuit output voltage to the requirements of the CRT. For example, in a specific embodiment constructed and tested, the parallel combination of resistors 164 and 166 was about 67 ohms, the value of resistor 156 was about 1.40 kilohms, the current through transistor 150 ranged from a minimum of one microampere to 2.5 milliamperes, and the current through transistor 152 ranged from a minimum of 20 microamperes to a maximum of 100 microamperes. Therefore, in summarizing the operation of the translation circuit 56, the volt-ampere characteristic of the diode-connected transistor 150 in series with the parallel combination of resistors 164 and 166 is utilized to effect a CRT characteristic curve-fitting function, the emitter resistance of transistor 150 effects a shift along that curve to establish the operating point of transistor 152 within a dynamic range mandated by the CRT, and transistor 152 provides a compressed output version of the average circuit current.

The multiplier circuit 58 receives the current output from the translation circuit 56 and develops a control voltage therefrom which is functionally related to the reciprocal of the duty cycle of the sweep gate signal. Emitter-coupled transistors 170 and 172 together with the linearizing diode-connected transistors 174 and 176 connected to the bases thereof from a basic Gilbert multiplier circuit. Input current is applied via transistors 152 and 174. A fixed current is applied to transistor 176 via a resistor 178. Emitter current for transistors 170 and 172 is supplied by a resistor 180 connected thereto, the other end of resistor 180 being connected to the emitter of a control transistor 182. The collectors of transistors 170, 174, and 176 are connected directly to a suitable positive low voltage supply, while the collector of transistor 172 is connected through a collector-load resistor 184 to a suitable positive voltage supply. A control loop including an operational amplifier 186 is connected between the collector of transistor 172 and the base of transistor 182. A reference voltage established by a voltage divider comprising resistors 188 and 190 is applied to the positive input terminal of operational amplifier 186, while the multiplier output at the collector of transistor 172 is applied to the negative input terminal. A capacitor 192 is connected across resistor 190 to stabilize the positive input against power supply variations, and a capacitor 194 is connected between the negative input terminal and the operational amplifier output to prevent oscillation. The collector of transistor 182 is connected to ground through the parallel combination of capacitor 196 and resistors 198 and 200. The output control voltage is developed across this parallel combination, and since this network is effectively included in the emitter circuit of the multiplier, a division function is actually performed, and, consequently, the control voltage is functionally related to the reciprocal of the sweep gate duty cycle. The effect is that when the sweep gate duty cycle is halved, e.g., reduced from 0.1 to 0.05, the output control voltage is effectively doubled. Conversely, doubling the sweep gate duty cycle causes the control voltage to be halved. Resistor 200 may suitably be the front-panel inensity or brightness control.

The overall circuit works as follows. Suppose that the triggering rate from incoming signals is reduced, causing a reduction in the number of sweeps per unit time to be integrated by the eye. This would result in an apparent dimming of the display. However, the reduction in the sweep gate duty cycle causes a reduction of output current from the averaging circuit. This action in turn results in a reduction of input current to the multiplier circuit from the translation circuit, increasing the base voltage of transistor 170, shifting current away from transistor 172. The corresponding rise in transistor 172 collector voltage is inverted by operational amplifier 186 and applied to the base of transistor 182. Transistor 182 increases its conduction, developing a positive-going rise in the control voltage developed across the output resistors 198 and 200. The increased control voltage is applied via the Z-axis amplifier to the CRT grid, increasing the beam intensity and consequently increasing the brightness of the perceived display.

The principles described hereinabove may be extended to dual-sweep oscilloscopes. FIG. 4 shows a block diagram of a multiplexed dual automatic intensity control system, wherein the two sweep generators are identified as the A sweep and the B sweep. The A and B sweep gate signals are applied to a pair of separate averaging circuits 250 and 252 respectively. These averaging circuits include gated current sources and thus are identical to those described earlier. The outputs from the averaging circuits are applied to a pair of translation circuits 254 and 256 respectively, which also operate as described earlier. The outputs from the translation circuits are applied to a switching circuit 260, which may be switched by a control signal which also switches or multiplexes the A and B sweep channels. Such switching circuits are well known in the art, and may suitably be a flipflop or a multivibrator which controls the conduction states of FET's or bipolar transistors through which the translation circuit output currents are to be passed. The single output from the switching circuit 260 is applied to a single multiplier circuit 262 to produce a control voltage to be applied to the CRT grid via the Z-axis amplifier to thereby control beam intensity of whichever sweep is being displayed. Alternatively, two multiplier circuits could be employed in an arrangement where the control voltage outputs therefrom are multiplexed.

While I have shown and described herein the preferred embodiment of my invention, it will be apparent to those skilled in the art that many changes and modifications may be made without departing from my invention in its broader aspects.

What I claim as being novel is:

1. An automatic intensity control circuit for an oscilloscope, comprising:
    means for receiving at least one periodic signal and producing an electrical average value which is proportional to the duty cycle of said periodic signal;
    means responsive to said average value for producing a control signal which is proportional to the reciprocal of said duty cycle of said periodic signal; and
    means for coupling said control signal to a cathode ray tube to control the beam current thereof.

2. An automatic intensity control circuit in accordance with claim 1 wherein said means for producing said electrical average value includes a current source coupled to capacitor, said current source being switched on and off by said periodic signal.

3. An automatic intensity control circuit in accordance with claim 2 further including automatic limit control means for turning on said current source after a predetermined time interval.

4. An automatic intensity control circuit in accordance with claim 3 wherein said automatic limit control means comprises a resettable timing circuit and electronic switch means coupled to said current source.

5. An automatic intensity control circuit in accordance with claim 1 wherein said means for producing a control signal includes a multiplier circuit.

6. An automatic intensity control circuit in accordance with claim 5 wherein said multiplier circuit comprises an emitter-coupled pair of transistors, a pair of linearizing diodes coupled to the respective bases of said transistors, a current-to-voltage converter circuit coupled to the emitters of said transistors, and a feedback loop coupled between one collector of said emitter-coupled pair of transistors and said current-to-voltage converter circuit.

7. An automatic intensity control circuit in accordance with claim 1 wherein said means for producing a control signal further includes a translation circuit including a nonlinear conduction device and a signal compression device for matching said control signal to operating characteristics of said cathode ray tube.

8. An automatic intensity control circuit in accordance with claim 1 further including means for receiving at least one additional periodic signal and producing an additional electrical average value which is proportional to the duty cycle of said additional periodic signal,
    and multiplexing means for providing a single control signal output.

* * * * *